PRINTED CIRCUIT SOLDERING AID

Filed Oct. 20, 1966 Sheet 1 of 2

INVENTOR.
MILTON H. ROSS

BY [signature]
[signature]
ATTORNEYS

INVENTOR.
MILTON H. ROSS
BY [signature]
[signature]
ATTORNEYS

United States Patent Office 3,452,976

Patented July 1, 1969

3,452,976

PRINTED CIRCUIT SOLDERING AID

Milton H. Ross, 2354 Fosgate Ave., Santa Clara, Calif. 95050

Filed Oct. 20, 1966, Ser. No. 588,682
Int. Cl. B23q *3/02;* B25b *1/06*
U.S. Cl. 269—91 6 Claims

ABSTRACT OF THE DISCLOSURE

A circuit board soldering aid for holding electrical components either in compression or tension, including a flexible boom attached to the base of a spring clamp through an angle bracket and hub assembly, which are so related as to provide rotational adjustment about two mutually exclusive axes. Positive compression or tension is maintained on a component by the joint action of friction washers and spring means associated with the said bracket and hub.

The invention described herein was made by an employee of the United States Government and may be manufactured and used by or for the Government for governmental purposes without the payment of any royalties thereon or therefor.

This invention relates to a soldering aid, tool, or article of manufacture which may be effectively employed for assembling printed circuits and holding electrical components either in compression or tension so as to achieve ease of assembly.

Printed circuit boards are generally constructed of a non-conducting material. By a process, not a part of this invention, copper conducting strips are applied to one or both sides of the board in any desired pattern or geometric arrangement. Generally, relatively small holes are drilled or otherwise produced in the board at one end of the conducting strips to accommodate electrical leads of components such as resistors, capacitors, diodes and the like. A drop of solder is applied to the leads so as to achieve an electrical conduction path between the leads and the conducting strips, and while this soldering operation is performed, the components are either held in compression or tension so as to achieve ease of soldering. Whether tension or compression is applied to the component depends on the individual doing the soldering, the component being soldered in position, and the location of the component on the board.

The general procedure for assembling printed circuit boards comprises (1) inserting the component in the card in the proper location, (2) rotating the card so as to expose the conductor leads previously done so, (3) trimming the leads to the proper length if not previously done so, (4) then soldering the leads to the conductor strip. This procedure is awkward and unsatisfactory because it requires three hands to do an effective job if a reliable soldering aid is not employed. One hand is required to hold the component in the proper position while the card is being rotated to the soldering position. Once the component is on the blind side of the board it is not known whether it is in the exact proper position or not. A second hand is needed to hold the solder, and a third hand is required to hold the soldering iron or gun.

However, for the purpose of fully developing the procedures for assembling a printed circuit card, it may be assumed a single individual is capable of performing the aforementioned procedure. There are a certain number of hazards attendant to the assembly operation. The individual is continually exposed to badly burning the fingers of the hand holding the component. If the fingers are burned, the natural reaction is to jerk the injured hand away which may result in pulling the component out of position permitting the melted solder to flow through openings in the board. Since the conductor strips are in close proximity to each other, this flowing solder could produce a short between two or more conductor strips thereby requiring the board to be discarded for repairs. Also, if this result occurred after the card had been partially assembled, jerking the hand away may also result in damage to previously assembled components.

Another possibility is the component is not jerked from position, but is released to shift to an unsatisfactory or undesirable position. Such a result would require performing the assembly operation over again, and if one of the leads had been soldered in position this may require a delicate rework operation.

In order to avoid the preceding inconveniences and possible adverse results, make-shift procedures have been employed. One such procedure on the work bench with the leads exposed and hold the component in position with it resting on the bench. Another procedure is to take the component to the board. Many other techniques are used, all of which are entirely unsatisfactory.

It may be assumed, for purposes of discussion, none of the foregoing adverse results occur. The mere awkwardness of assembling the components renders the situation unsatisfactory. If a printed circuit board is completely assembled without the use of an adequate soldering aid it is almost a certainty some units will have to be reworked because the assembler was required to assume an awkward fatigue inducing posture for an extended period of time thereby reducing his ability to continuously perform a delicate and exact operation.

The instant invention, hereinafter to be described in greater detail, is a soldering aid or tool which functions as a third hand and releases both the assembler's hands so they may be employed in the actual soldering operation, thereby avoiding the aforementioned hazards and adverse conditions.

The tool includes a boom or arm which has at least two degrees of freedom, i.e., it may be rotated toward or away from the component to be held, it may be rotated in a direction coplanar to the card and it may be extended or retracted as required to reach certain components. Associated with the boom is means for releasably attaching the boom to the printed circuit card. Of considerable importance is the fact a frictional bias may be applied to the boom whereby compression or tension when applied thereto will in turn be applied to the component to firmly hold the latter in a selected position, yet the applied compression or tension will not be such as to damage the component.

Printed circuit soldering aids are not unknown, but for one reason or more they have proven to be unsatisfactory. For instance, one of the most prominently used devices comprises a pair of alligator clips which are connected by a rubber band. Such a device is designed to hold a component in tension but not compression, and further, it is incapable of firmly holding a component in a selected position even in tension. A single drop of solder on the rubber band will destroy the soldering aid. As a matter of fact an extensive list of unacceptable features could be provided, but the foregoing is considered adequate to illustrate the prior art is not anticipatory of the present invention. Other less well known soldering aids are also employed but they are adequate for more reasons than have above been defined.

Figure 1:
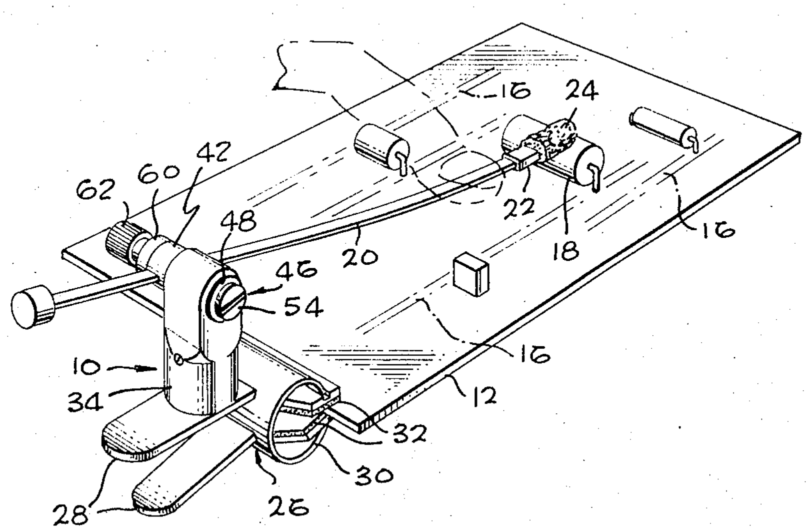
FIGURE 1 is a perspective view illustrating the invention, and showing the manner of applying frictional bias to the boom which in turn applies compression to the component to hold the component in the selected position.
Figure 2:
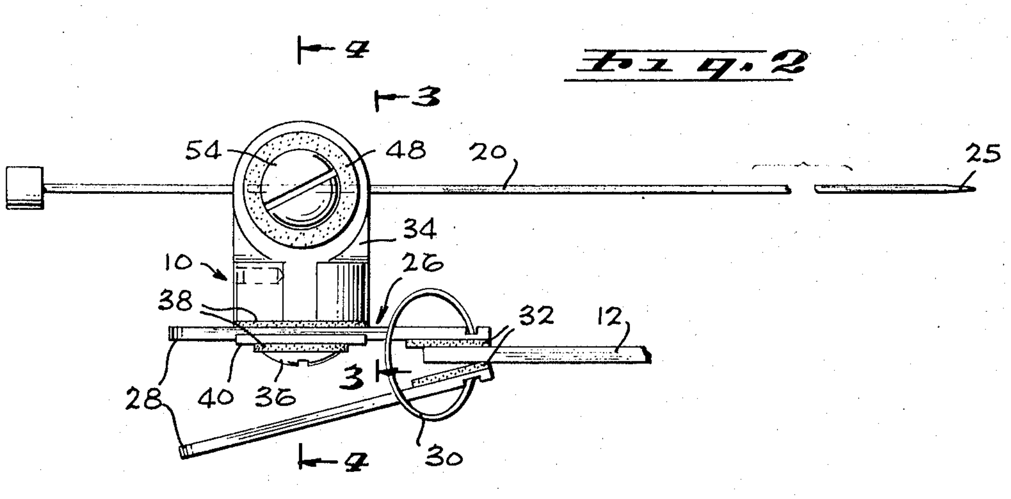
FIGURE 2 is a side elevational view of the soldering aid, the dotted lines illustrating the position the boom may be made to assume.
Figure 3:
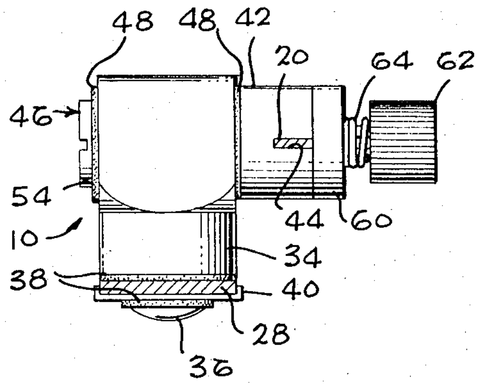
FIGURE 3 is a view taken on line 3—3 of FIGURE 2, a portion of the structure being in cross-section.
Figure 4:
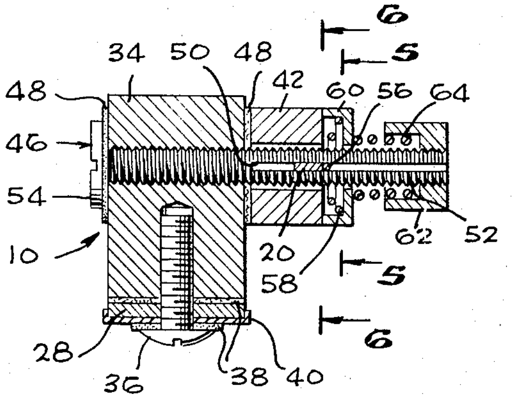
FIGURE 4 is a cross-sectional view of the device taken on line 4—4 of FIGURE 2.
Figure 5:
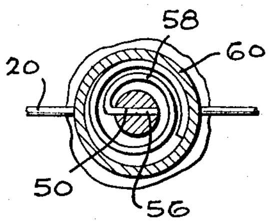
FIGURE 5 is a cross-sectional view taken on line 5—5 of FIGURE 4 looking in the direction of the arrows.
Figure 6:
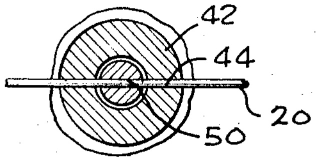
FIGURE 6 is a cross-sectional view taken on line 6—6 of FIGURE 4 looking in the direction indicated.

Referring initially to FIGURE 1, the soldering aid 10 is shown removably attached to a printed circuit card on board 12. Mounted on board 12 are several electrical or electronic components which have been soldered in place and which are in electrical contact with conductor strips 16. Another electrical component 18 is being firmly held in compression in the selected position by the boom or arm 20 of the aid or tool 10. Removably slidable on the end of boom 20 and in contacting engagement with component 18 is a relatively short sleeve 22 having bonded thereto a fiber like pad 24 which is in contacting engagement with component 18 the fiber pad protecting the component from possible damage. Use of the sleeve 22 and pad 24 is a precaution to protect component 18, but it is to be understood the tapered end 25 of the boom may be placed in contacting engagement with component 18 with little likelihood of damage occurring.

The manner of attaching soldering aid 10 to card 12 is by medium of a spring loaded clamp 26 which comprises a pair of flat plates 28 biased toward each other by a C-shaped spring 30. Bonded to the internal surface of each plate 28 is an elastomer or fiber material pad 32 which is designed to prevent damage to card 12.

Rotatably mounted on clamp 26 is a generally cylindrical boom support bracket 34. Attachment of bracket 34 to clamp 26 is achieved by friction adjusting screw 36, with fiber washers 38 and tension spring 40 providing smooth 360° rotation of the bracket.

Extending generally perpendicular to the longitudinal axis of bracket 34 is a rotatable hub 42 having a slot or channel 44 extending there through to freely receive the flat elongated boom 20 which, as is illustrated in FIGURE 1, is fabricated of a resilient material. The boom is freely extendible and retractable so as to reach components near and remote to aid 10. However, structure, hereinafter described in greater detail, is provided to restrain the boom in a selected position.

Extending through hub 42 is an elongated friction adjusting screw 46 with fiber washers 48 providing relatively smooth 360° rotation of hub 42 and boom 20. Washers 48 perform substantially the same function for hub 42 and boom 20 as washers 38 perform for bracket 34. Screw 46 has an elongated slot 50 therein extending from the free threaded end 52 thereof to near but spaced from head 54. Slot 50 accommodates and receives boom 20 and the free end 56 of a tension spring 58, the latter biasing the boom against the bottom of slot 44 to inhibit extension and retraction of the boom.

Tension spring 58 is disposed in spring housing or cup 60 which is in contacting engagement with hub 42.

As friction adjusting screw 46 is turned in one direction it pulls a spring accommodating cup 62 which is threaded on end 52 toward bracket 34. Disposed in cup 62 and circumscribing screw 46 is a compression spring 64 which bears against cup 60. As compression is applied to spring 64 by screw 46 the force is transmitted to fiber washers 48 to compress the same and thereby provide a frictional bias to rotation of hub 42. Thus, it may be seen if hub 42 is under frictional bias with boom 20 in the position illustrated in FIGURE 1, a downwardly directed force applied to the boom midway between the ends thereof will cause the boom to bow and have the introduced compression force transmitted to component 18. As a result of the aforementioned frictional bias, it may be seen the quantity of force applied to component 18 may be predetermined. In other words, a relatively light downward force will result in a relatively light compression force being applied to component 18 and a greater downward force will impose a greater compression force on the component. If it is determined the frictional bias on hub 42 is not adequate to retain boom 20 in the bowed condition, tightening screw 46 will increase frictional bias. Loosening the screw will obviously produce an opposite result permitting the boom to be repositioned for another operation.

Likewise, if screw 36 is tightened frictional bias on bracket 34 will be increased and the reverse operation will permit bracket 34 to be rotated to reposition boom 20. The force applied to boom 20 by spring 58 is sufficient to prevent unrestricted extension and retraction of boom 20.

A variety of component holding attachments may be removably applied to the tapered end 25 of boom 20 such as a tubular attachment 65 which has removably slidable thereon an alligator clip 66. The rear tubular portion 67 of clip 66 is split so as to achieve ease of application of the clip to attachment 65 (see FIGURE 8).

Figure 8:
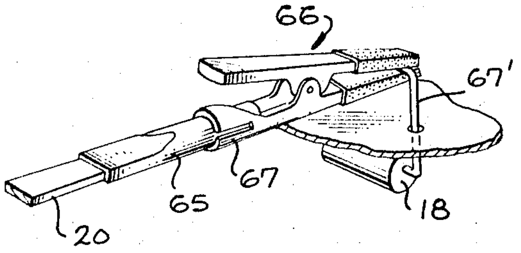
FIGURE 8 is a perspective view illustrating the component engaging end of the boom having removably attached thereto an alligator clip grasping an electrical component and holding it in tension.

Particular attention is directed to conditions illustrated in FIGURE 8 as contrasted with that illustrated in FIGURE 1. In the latter figure, component 18 is being held in compression whereas in FIGURE 8 the component is being held in tension. In other words, the padded jaws of clip 66 has clamped therebetween an electrical lead 67 of the component. A force reverse of that applied to boom 20 in FIGURE 1 is applied to the boom in FIGURE 8 to thereby hold component 18 in tension while the lead is soldered to the board. After soldering occurs, the lead is trimmed to the proper length.

Figure 7:
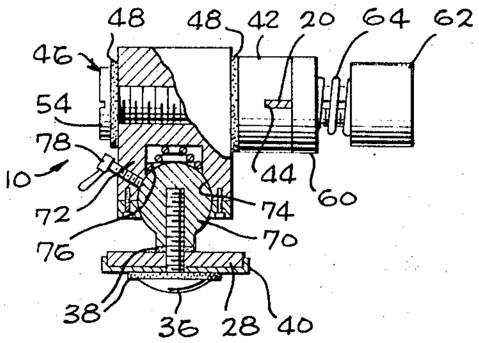
FIGURE 7 is a side elevational view of another form of the invention illustrating in partial cross-section a ball and socket joint arrangement which provides three degrees of freedom for the boom or arm.

The form of invention illustrated in FIGURE 7 is substantially identical to the form previously described with one exception, a ball 70 is rigidly attached to clamp 26 by screw 36, and bracket 72 comparable to bracket 34 has a ball accommodating socket 74 therein. Also disposed in socket 74 is a compression spring 76 which imposes a frictional bias on the ball to inhibit unrestricted rotational movement of bracket 72. To further restrict rotational movement of bracket 72 a butterfly screw 78 is provided which bears against ball 70. In order to prevent scoring or damage to ball 70 screw 78 is fabricated of an elastomer material such as nylon. In the absence of spring 76 and screw 78 the compression or tension applied to boom 20 would be transmitted to the ball and socket arrangement which would result in movement of bracket 72 and loss of tension or compression on component 18. The ball and socket assembly provides three degrees of freedom of boom 20 to thereby provide greater latitude of use of the tool.

While the present invention has been described herein in what is considered to be preferred embodiments thereof, it should be recognized that departures may be made therefrom within the scope of the invention, and it should therefore not be limited to the details of the within disclosure, but should be accorded the full scope of the appended claims.

What is claimed is:

1. A printed circuit soldering aid for firmly holding electronic components in a selected position preliminary to soldering which comprises: a clamp removably attached to a printed circuit card; a support bracket assembly mounted on said clamp and having an opening therethrough; and a boom assembly which comprises a rotatable hub having a central opening therethrough in linear alignment with the opening in said bracket assembly, a boom extendably and retractably supported by said hub, a compressible washer between said hub and said bracket assembly in frictional engagement with each, a friction adjusting screw extending through the openings in said bracketand hub, a spring receiving cup threaded onto said screw, and a compression spring between said hub and said cup in contacting engagement with each whereby when said friction adjusting screw is turned one way to compress said spring and thereby said washer a frictional bias is imposed on said boom assembly with the result a directed pressure applied to said boom will be retained and transmitted to said component to thereby hold said component in the selected position while soldering.

2. A printed circuit soldering aid according to claim 1 wherein said support bracket is rotatably mounted on said clamp.

3. A printed circuit soldering aid for firmly holding electronic components in a selected position preliminary to soldering which comprises: a clamp removably attached to a printed circuit card; a support bracket assembly mounted on said clamp and having an opening therethrough; and a boom assembly which comprises a rotatable hub having a central opening therethrough in linear alignment with the opening in said bracket assembly; said hub having a boom receiving channel therethrough which is substantially perpendicular to said opening, a boom supported within said channel, said boom being freely extendable and retractable in said channel, a compressible washer between said hub and said bracket assembly in frictional engagement with each, a first spring receiving cup in opposed relationship to said washer and in contacting engagement with said hub, said cup having a central opening therein in linear alignment with the opening in said hub, a spring located in said first cup in engagement with said boom to thereby bias the boom in said channel to hold the boom in a selected position, a friction adjusting screw extending through the openings in said bracket, hub and first cup, said screw having a boom receiving slot therein which is in alignment with the channel in said hub, a second spring receiving cup threaded onto said screw, and a compression spring between said first and second cups and in contacting engagement with each whereby when said friction adjusting screw is turned one direction to compress the spring between said first and second cups and thereby compress said washer a frictional bias is imposed on said boom assembly with the result a directed pressure applied to said boom will be retained and transmitted to said component to thereby hold said component in the selected position while soldering.

4. A printed circuit soldering aid for firmly holding electronic components in a selected position preliminary to soldering which comprises: a clamp removably attached to a printed circuit card, a support bracket assembly rotatably mounted on said clamp and having an opening therethrough, said bracket assembly comprising a first compressible washer, and a first friction adjusting screw employed to attach said support bracket to said clamp whereby turning of said first screw in one direction to compress said washer thereby imposes a frictional bias on said bracket assembly to hold said assembly in a selected position; and a resilient boom assembly which comprises a rotatable hub having a central opening therethrough in linear alignment with the opening in said bracket assembly, a boom extendably and retractably supported by said hub, a second compressible washer between said hub and said bracket assembly in frictional engagement with each, a second friction adjusting screw extending through the openings in said bracket and hub, a spring receiving cup threaded onto said screw, and a compression spring between said hub and said cup and in contacting engagement with each whereby when said friction adjusting screw is turned one way to compress said spring and thereby said washer a frictional bias is imposed on said boom assembly with the result a directed pressure applied to said boom will be retained and transmitted to said component to thereby hold said component in the selected position while soldering.

5. A printed circuit soldering aid for firmly holding electronic components in a selected position preliminary to soldering which comprises: a clamp removably attached to a printed circuit card, a support bracket assembly rotatably mounted on said clamp and having an opening therethrough, said bracket assembly comprising a first compressible washer, and a first friction adjusting screw employed to attach said support bracket to said clamp whereby turning of said first screw in one direction to compress said washer thereby impose a frictional bias on said bracket assembly to hold said assembly in a selected position; and a boom assembly which comprises a rotatable hub having a central opening therethrough in linear alignment with the opening in said bracket assembly, said hub having a boom receiving channel therethrough which is substantially perpendicular to said opening, a flexible boom supported within said channel, said boom being freely extendable and retractable in said channel, a second compressible washer between said hub and said bracket assembly in frictional engagement with each, a first spring receiving cup in opposed relationship to said second washer and in contacting engagement with said hub, said cup having a central opening therein in linear alignment with the opening in said hub, a spring located in said first cup in engagement with said boom to thereby bias the boom in said channel to hold the boom in a selected position, a second friction adjusting screw extending through the openings in said bracket, hub and first cup, said second screw having a boom receiving slot therein which is in alignment with the channel in said hub, a second spring receiving cup threaded onto said second screw, and a compression spring between said first and second cups and in contacting engagement with each whereby when said second friction adjusting screw is turned one direction to compress the spring between said first and second cups and thereby compress said second washer a frictional bias to impose on said boom assembly with the result a directed pressure applied to said boom will be retained and transmitted to said component to thereby hold said component in the selected position while soldering.

6. A printed circuit soldering aid for firmly holding electronic components in a selected position preliminary to soldering which comprises: a clamp removably attached to a printed circuit card; a support bracket assembly rotatably mounted on said clamp and having an opening therethrough, said bracket assembly comprising a ball attached to said clamp by a fastener, a bracket having a socket therein to receive said ball, and a loaded compression spring disposed in said socket and in firm engagement with said ball to thereby impose a frictional bias on said ball to hold said bracket assembly in a selected position; and a boom assembly which comprises a rotatable hub having a central opening therethrough in linear alignment with the opening in said bracket assembly, a boom extendably and retractably supported by said hub, a compressible washer between said hub and said bracket assembly in frictional engagement with each, a friction adjusting screw extending through the openings in said bracket and hub, a spring receiving cup threaded onto said screw, and a compression spring between said hub and said cup and in contacting engagement with each whereby when said friction adjusting screw is turned one way to compress said spring and thereby said washer a frictional bias is imposed on said boom assembly with the result a directed pressure applied to said boom will be retained and transmitted to said component to thereby hold said component in the selected position while soldering.

References Cited

UNITED STATES PATENTS

| | | | |
|---|---|---|---|
| 501,863 | 7/1893 | Blake | 269—254 X |
| 1,005,010 | 10/1911 | Farnsworth | 269—91 X |
| 1,285,018 | 11/1918 | Bryant | 248—286 X |
| 2,460,944 | 2/1949 | Nighthart | 269—84 X |

ROBERT C. RIORDON, *Primary Examiner.*

J. F. McKEOWN, *Assistant Examiner.*

U.S. Cl. X.R.

24—73, 248; 248—229, 286; 269—254